(12) United States Patent
Tsukuda

(10) Patent No.: US 7,042,279 B2
(45) Date of Patent: May 9, 2006

(54) REFERENCE VOLTAGE GENERATING CIRCUIT

(75) Inventor: Kazuaki Tsukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 31 days.

(21) Appl. No.: 10/878,603

(22) Filed: Jun. 29, 2004

(65) Prior Publication Data

US 2005/0189985 A1 Sep. 1, 2005

(30) Foreign Application Priority Data

Feb. 27, 2004 (JP) .............................. 2004-053459

(51) Int. Cl.
*H02J 1/00* (2006.01)

(52) U.S. Cl. ...................... 327/539; 323/313
(58) Field of Classification Search ................ 327/539, 327/362, 538; 323/282, 285, 313, 314
See application file for complete search history.

(56) References Cited

U.S. PATENT DOCUMENTS 5,610,506 A * 3/1997 McIntyre .................... 323/313
6,204,653 B1 * 3/2001 Wouters et al. ............. 323/313
6,509,726 B1 * 1/2003 Roh .......................... 323/313
6,542,027 B1 * 4/2003 Zha et al. ................... 327/540
6,815,941 B1 * 11/2004 Butler ........................ 323/313

FOREIGN PATENT DOCUMENTS

JP 2000-181554 6/2000

* cited by examiner

*Primary Examiner*—Dinh T. Le
(74) *Attorney, Agent, or Firm*—Arent Fox PLLC

(57) ABSTRACT

A reference voltage generating circuit is provided that includes: a differential amplifier amplifying an input signal and generate a reference voltage; an output amplifier amplifying the reference voltage and outputting the amplified reference voltage; and a startup circuit connected between an output terminal of the differential amplifier and an input terminal of the output amplifier. The startup circuit has a first switch and a second switch. The first switch connects the output terminal of the differential amplifier and the input terminal of the output amplifier according to a voltage of an output terminal of the output amplifier. The second switch connects the input terminal and the output terminal of the output amplifier according to a voltage of the output terminal of the differential amplifier.

14 Claims, 3 Drawing Sheets

F I G. 1
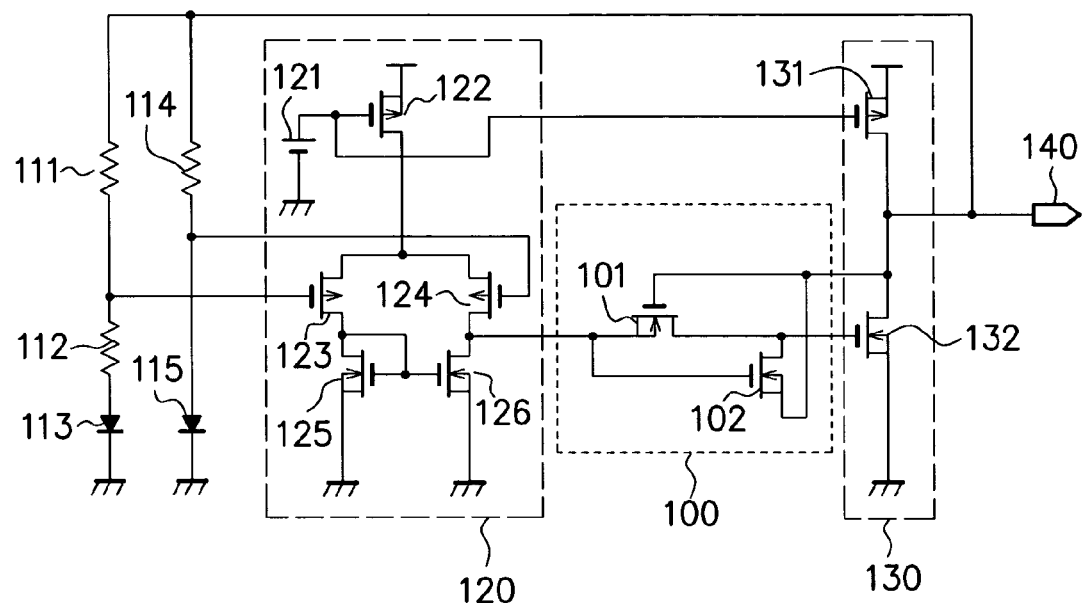

REFERENCE VOLTAGE GENERATING CIRCUIT

CROSS-REFERENCE TO RELATED APPLICATIONS

This application is based upon and claims the benefit of priority from the prior Japanese Patent Application No. 2004-053459, filed on Feb. 27, 2004, the entire contents of which are incorporated herein by reference.

BACKGROUND OF THE INVENTION

1. Field of the Invention

The present invention relates to a reference voltage generating circuit having a startup circuit.

2. Description of the Related Art

FIG. 2 shows a configuration example of a reference voltage generating circuit 200 and a startup circuit 210 thereof according to a prior art.

First, the configuration of the reference voltage generating circuit 200 will be described. A resistor 111 is connected between a gate of a p-channel MOS field-effect transistor (hereinafter, referred to as FET) 123 and an output terminal 140. A resistor 112 is connected between the gate of the MOSFET 123 and an anode of a diode 113. A cathode of the diode 113 is connected to a ground potential. A resistor 114 is connected between a gate of a p-channel MOSFET 124 and the output terminal 140. A diode 115 has an anode connected to the gate of the MOSFET 124 and a cathode connected to the ground potential.

A differential amplifier 120 has a direct-current power supply 121 and MOSFETs 122 to 126. The direct-current power supply 121 has an anode connected to a gate of the p-channel MOSFET 122 and a cathode connected to the ground potential. The p-channel MOSFET 122 has a source connected to a power supply potential and a drain connected to a junction point between sources of the p-channel MOSFETs 123, 124. Gates of the n-channel MOSFETs 125, 126 are connected to each other, and a junction point therebetween is connected to a drain of the MOSFET 123. The n-channel MOSFET 125 has a drain connected to the drain of the MOSFET 123 and a source connected to the ground potential. The n-channel MOSFET 126 has a drain connected to a drain of the MOSFET 124 and a source connected to the ground potential.

An output amplifier 130 has MOSFETs 131, 132. The p-channel MOSFET 131 has a gate connected to the anode of the direct-current power supply 121, a source connected to a power supply potential, and a drain connected to the output terminal 140. The n-channel MOSFET 132 has a gate connected to the drain of the MOSFET 124, a drain connected to the output terminal 140, and a source connected to the ground potential.

Next, the configuration of the startup circuit 210 will be described. A direct-current power supply 211 has an anode connected to a gate of a p-channel MOSFET 212 and a cathode connected to the ground potential. The p-channel MOSFET 212 has a source connected to a power supply potential and a drain connected to a drain of an n-channel MOSFET 213. The n-channel MOSFET 213 has a gate connected to the output terminal 140 and a source connected to the ground potential. Gates of p-channel MOSFETs 214, 216 are connected to each other and a junction point therebetween is connected to a drain of the MOSFET 214. The MOSFET 214 has a source connected to the power supply potential and a drain connected to a drain of an n-channel MOSFET 215. The MOSFET 215 has a gate connected to the drain of the MOSFET 212 and a source connected to the ground potential. A MOSFET 216 has a source connected to the power supply potential and a drain connected to a gate of the MOSFET 124.

FIG. 3A shows output voltages 302a, 302b of the output terminal 140 of the reference voltage generating circuit 200 when the startup circuit 210 is not provided. The horizontal axis represents time [t] after power application, and the vertical axis represents voltage [V]. After the power application, a power supply voltage 301 gradually increases and is stabilized at Vcc [V] before long. The reference voltage generating circuit 200 outputs one of two kinds of the output voltages 302a, 302b according to manufacturing variation or the like. It is not possible to assure which one of two kinds of the output voltages 302a, 302b is outputted. As a result, the output voltage (reference voltage) of the reference voltage generating circuit 200 has two stabilization points 0 [V] and Vo [V]. Vo [V] is a desired stabilization point of the output voltage and 0 [V] is an undesired stabilization point of the output voltage.

FIG. 3B, which corresponds to FIG. 3A, shows the output voltage 302a of the output terminal 140 when the startup circuit 210 is connected to the reference voltage generating circuit 200. The startup circuit 210 is capable of leading the output voltage of the reference voltage generating circuit 200 to the one desired stabilization point Vo [V] out of the two stabilization points 0 [V] and Vo [V]. This can ensure that the reference voltage generating circuit 200 outputs the desired output voltage 302a in accordance with the increase in the power supply voltage 301.

Next, the operation of the reference voltage generating circuit 200 without the startup circuit 210 will be described. The reference voltage generating circuit 200 has a two-stage amplification circuit constituted of the differential amplifier 120 and the output amplifier 130. When an offset does not exist in the differential amplifier 120, the output voltage 302a is outputted, whereas, when the offset exists, the output voltage 302b is outputted. Specifically, in the differential amplifier 120, the MOSFETs 125, 126 function as current mirrors, and a voltage according to the output voltage of the output terminal 140 is feedback-inputted to the gates of the differential input MOSFETs 123, 124 of the differential amplifier 120, so that the MOSFETs 123, 124 are feedback-controlled to have equal drain voltages. When the drain voltages of the differential input MOSFETs 123, 124 are the same, which means that no offset exists, the output voltage 302a is outputted. On the other hand, when an offset of difference in drain voltage between the MOSFETs 123, 124 by a predetermined voltage (for example, 10 mV) or more exists due to manufacturing variation or the like, the output voltage 302b is outputted.

When the output voltage 302a in FIG. 3A is outputted, the power supply voltage 301 gradually increases after the power application, so that a voltage of the direct-current power supply 121 also gradually increases. Then, the output voltage 302a of the output terminal 140 also gradually increases and before long, the output voltage 302a is kept at the reference voltage Vo.

On the other hand, when the output voltage 302b in FIG. 3A is outputted, the power supply voltage 301 gradually increases after the power application and the output voltage 302b of the output terminal 140 also increases. Here, an offset exists in the differential amplifier 120, resulting in difference in drain voltage between the MOSFETs 123, 124. For example, the drain voltage of the MOSFET 123 becomes a low voltage as a minus offset, while the drain voltage of the MOSFET 124 becomes a high voltage as a plus offset. Then, the n-channel MOSFET 132 operates so as to turn on, so that the output voltage 302b of the output terminal 140 decreases. The decrease in the output voltage 302b causes by feedback the decrease in gate voltages of the input MOSFETs 123, 124 of the differential amplifier 120, and then the drain voltage of the p-channel MOSFET 124 increases. By this feedback loop, the output voltage 302b gradually decreases to stabilize at 0 [V] before long.

Next, the operation of the reference voltage generating circuit 200 with the startup circuit 210 connected thereto will be described. In this case, the output voltage 302a in FIG. 3B is outputted. After the power application, the power supply voltage 301 and the output voltage 302a gradually increase. The voltage 302a of the output terminal 140 of the reference voltage generating circuit 200 is monitored at the gate of the n-channel MOSFET 213 that is an input of the startup circuit 210. When the output voltage 302a of the reference voltage generating circuit 200 is lower than a threshold voltage of the n-channel MOSFET 213, the MOSFET 213 turns off. At this time, the gate voltage of the n-channel MOSFET 215 increases since the p-channel MOSFET 212 is a constant-current source, so that the MOSFET 215 turns on and a current flows therethrough. This current also flows through the p-channel MOSFET 214. Then, the same current also flows through the p-channel MOSFET 216 that has a current-mirror relation with the p-channel MOSFET 214. The current flowing through the p-channel MOSFET 216 increases the gate voltage of the input MOSFET 124 of the differential amplifier in the reference voltage generating circuit 200. As a result, a gate voltage of the n-channel MOSFET 132 lowers to increase the output voltage 302a of the reference voltage generating circuit 200.

When the output voltage 302a of the reference voltage generating circuit 200 increases to be equal to or more than the threshold voltage of the n-channel MOSFET 213 in the startup circuit 210, the n-channel MOSFET 213 turns on and the n-channel MOSFET 215 turns off due to the decrease in its gate voltage. Accordingly, the p-channel MOSFET 216 also turns off, so that the startup circuit 210 is disconnected from the reference voltage generating circuit 200 and the startup operation is stopped. Thereafter, by the operation of the reference voltage generating circuit 200, the output voltage 302a reaches the stabilization point Vo [V]. As described above, the startup circuit 210 operates so as to increase the output voltage 302a when the output voltage 302a of the reference voltage generating circuit 200 is low, and when the output voltage 302a becomes sufficiently high, it operates so as to stop the startup operation.

The following patent document 1 also discloses in FIG. 5 a startup circuit of a reference voltage generating circuit.

(Patent Document 1) Japanese Patent Application Laid-open No. 2000-181554

SUMMARY OF THE INVENTION

It is an object of the present invention to provide a reference voltage generating circuit including a startup circuit which requires only a small number of components and whose circuit is simple and easy to design.

It is another object of the present invention to provide a reference voltage generating circuit including a startup circuit without any unnecessary current flowing therethrough, and thus achieving reduction in power consumption.

According to one of the aspects of the present invention, a reference voltage generating circuit is provided that includes: a differential amplifier amplifying an input signal and generate a reference voltage; an output amplifier amplifying the reference voltage and outputting the amplified reference voltage; and a startup circuit connected between an output terminal of the differential amplifier and an input terminal of the output amplifier. The startup circuit has a first switch and a second switch. The first switch connects the output terminal of the differential amplifier and the input terminal of the output amplifier to each other according to a voltage of an output terminal of the output amplifier. The second switch connects the input terminal and the output terminal of the output amplifier according to a voltage of the output terminal of the differential amplifier.

BRIEF DESCRIPTION OF THE DRAWINGS

FIG. 1 is a circuit diagram showing a configuration example of a reference voltage generating circuit including a startup circuit according to an embodiment of the present invention;

DETAILED DESCRIPTION OF THE PREFERRED EMBODIMENTS

Figure 2:
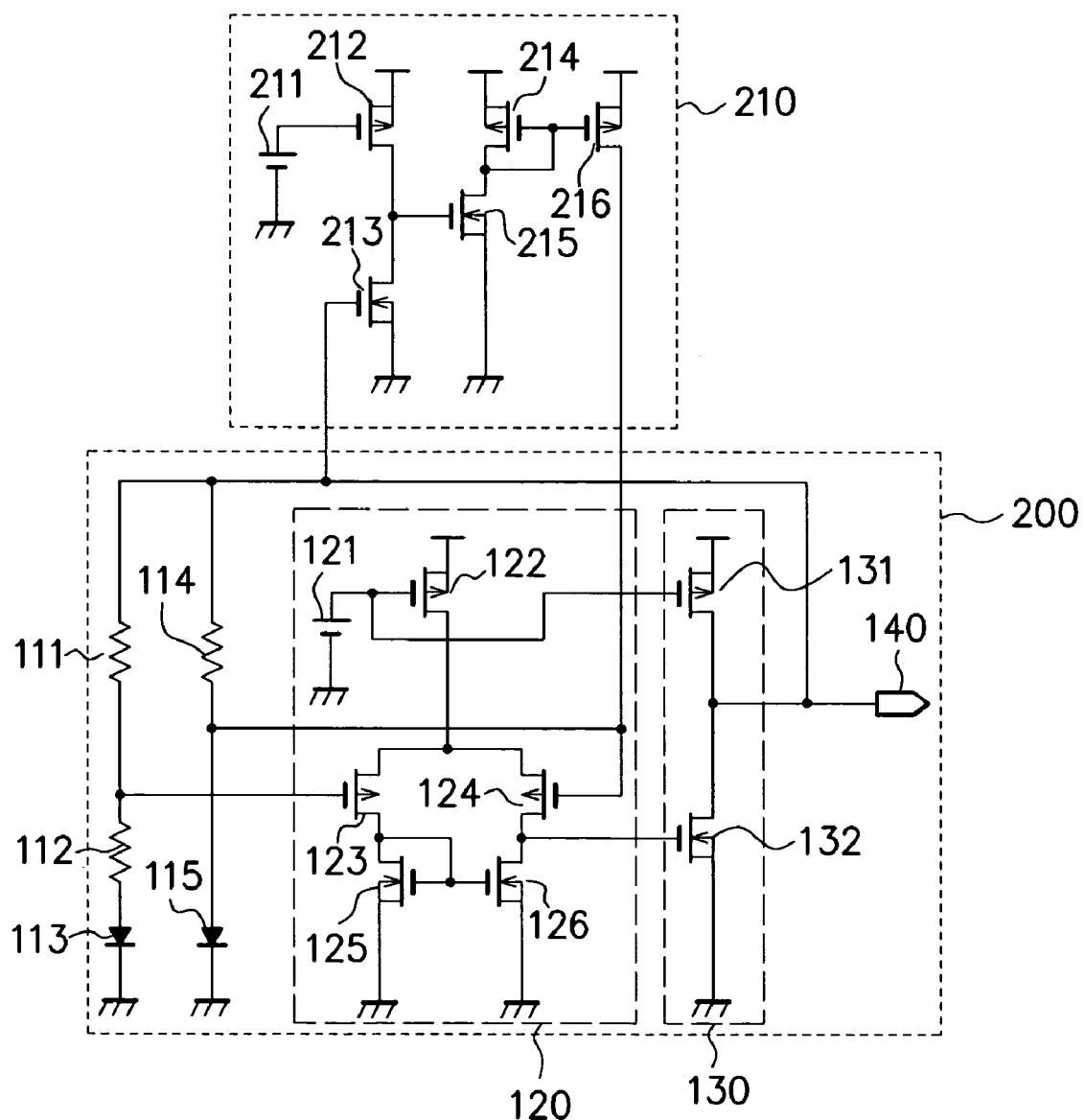
FIG. 2 is a circuit diagram showing a configuration example of a reference voltage generating circuit and its startup circuit according to a prior art.

The startup circuit 210 shown in FIG. 2 uses 5 MOSFETs, which is a large number of components. Further, since the n-channel MOSFET 213 determines the voltage for starting or stopping the startup operation based on its threshold voltage, the freedom degree of the size is low, resulting in difficulty in size adjustment. Further, the n-channel MOSFET 213 and the p-channel MOSFET 212 turn on simultaneously at the normal operation time after the startup operation is stopped, so that an unnecessary current flows through the MOSFETs 212, 213.

FIG. 1 shows a configuration example of a reference voltage generating circuit according to an embodiment of the present invention. The reference voltage generating circuit includes a startup circuit 100. Portions except the startup circuit 100 in the reference voltage generating circuit are the same as those in the reference voltage generating circuit 200 in FIG. 2.

First, the portions except the startup circuit 100 will be described. A resistor 111 is connected between a gate of a p-channel MOS field-effect transistor (hereinafter, referred to as FET) 123 and an output terminal 140. A resistor 112 is connected between the gate of the MOSFET 123 and an anode of a diode 113. A cathode of the diode 113 is connected to a ground potential. A resistor 114 is connected between a gate of a p-channel MOSFET 124 and the output terminal 140. A diode 115 has an anode connected to the gate of the MOSFET 124 and a cathode connected to the ground potential.

A differential amplifier 120 has a direct-current power supply 121 and MOSFETs 122 to 126. Input terminals of the differential amplifier 120 are gates of p-channel MOSFETs 123, 124. An output terminal of the differential amplifier 120 is a junction point between a drain of the p-channel MOSFET 124 and a drain of the n-channel MOSFET 126. The direct-current power supply 121 has an anode connected to a gate of the p-channel MOSFET 122 and a cathode connected to the ground potential. The p-channel MOSFET 122 has a source connected to a power supply potential and a drain connected to a junction point between sources of the p-channel MOSFETs 123, 124. Gates of the n-channel MOSFETs 125, 126 are connected to each other, and a junction point therebetween is connected to a drain of the MOSFET 123. The n-channel MOSFET 125 has a drain connected to the drain of the MOSFET 123 and a source connected to the ground potential. The n-channel MOSFET 126 has a drain connected to the drain of the MOSFET 124 and a source connected to the ground potential.

An output amplifier 130 has MOSFETs 131, 132. An input terminal of the output amplifier 130 is a gate of the n-channel MOSFET 132. The output terminal 140 of the reference voltage generating circuit also serves as an output terminal of the output amplifier 130. The p-channel MOSFET 131 has a gate connected to the anode of the direct-current power supply 121, a source connected to a power supply potential, and a drain connected to the output terminal 140. The n-channel MOSFET 132 has a gate connected to the startup circuit 100, a drain connected to the output terminal 140, and a source connected to the ground potential.

Next, the configuration of the startup circuit 100 will be described. The startup circuit 100 has n-channel MOSFETs 101, 102. The n-channel MOSFET 101 has a gate connected to the output terminal 140, a source connected to the junction point (the output terminal of the differential amplifier 120) between the drains of the MOSFETs 124, 126, and a drain connected to the gate (the input terminal of the output amplifier 130) of the n-channel MOSFET 132. The n-channel MOSFET 102 has a gate connected to the junction point (the output terminal of the differential amplifier 120) between the drains of the MOSFETs 124, 126, a source connected to the output terminal 140, and a drain connected to the gate (the input terminal of the output amplifier 130) of the n-channel MOSFET 132.

Figure 3A:
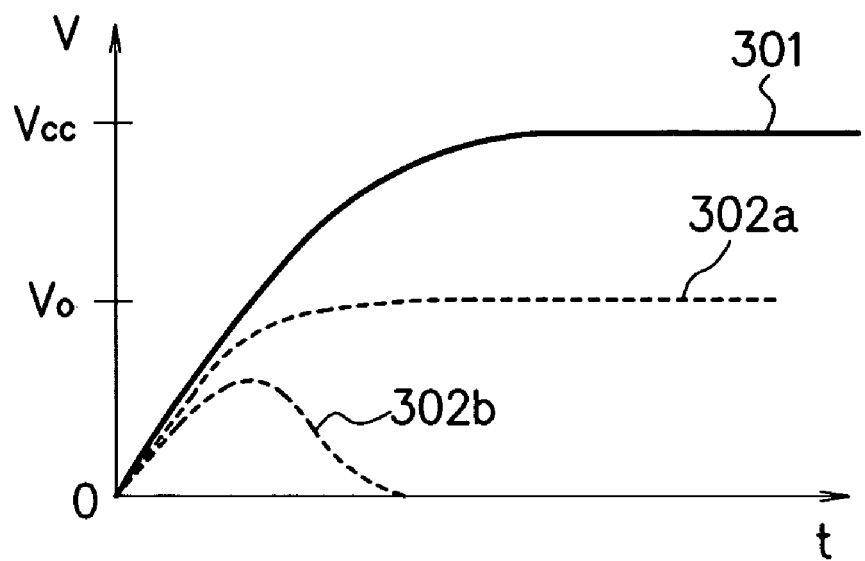
FIG. 3A and FIG. 3B are charts to explain the operation of the reference voltage generating circuit.

Eliminating the startup circuit 100 and short-circuiting the output terminal of the differential amplifier 120 and the input terminal of the output amplifier 130 will result in the same circuit as the reference voltage generating circuit 200 in FIG. 2. In this case, the reference voltage generating circuit outputs one of two kinds of output voltages 302*a*, 302*b* as shown in FIG. 3A according to manufacturing variation or the like. It is not possible to assure which one of two kinds of the output voltages 302*a*, 302*b* is outputted. As a result, the output voltage (reference voltage) of the reference voltage generating circuit has two stabilization points 0 [V] and Vo [v]. Vo [V] is a desired stabilization point of the output voltage and 0 [V] is an undesired stabilization point of the output voltage.

Figure 3B:
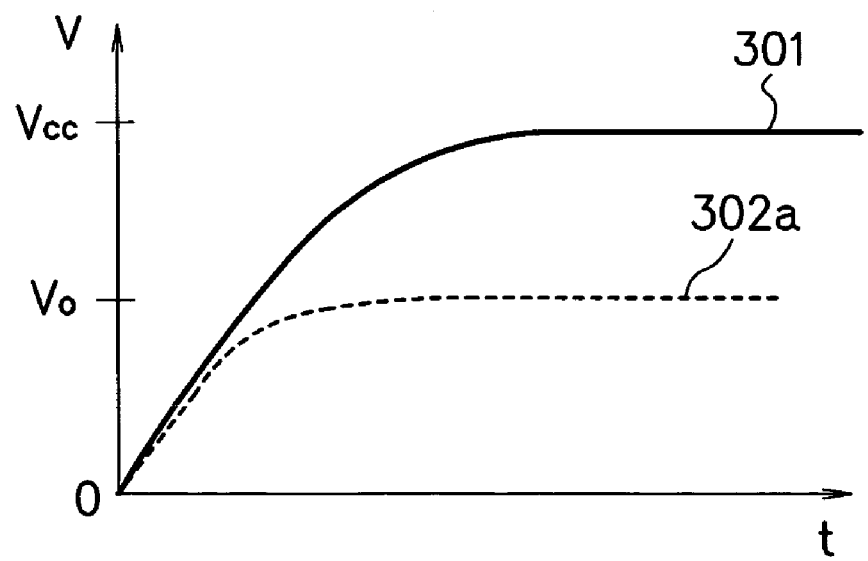

When the startup circuit 100 is provided in the reference voltage generating circuit as shown in FIG. 1, the startup circuit 100 is capable of leading the output voltage of the reference voltage generating circuit to the one desired stabilization point Vo [V] out of the two stabilization points 0 [V] and Vo [V] as shown in FIG. 3B. This can ensure that the reference voltage generating circuit outputs the desired output voltage 302*a* in accordance with the increase in the power supply voltage 301.

Next, the operation of the reference voltage generating circuit including the startup circuit 100 will be described. The output voltage of this reference voltage generating circuit has two stabilization points, for example, 0 [V] and Vo=1.2 [V]. A power supply voltage Vcc is, for example, 3 [V], 2.5 [V], 1.8 [V], or the like. When the startup circuit 100 is provided, the output voltage 302*a* in FIG. 3B is outputted. After the power application, the power supply voltage 301 gradually increases, but the output voltage 302*a* remains 0 [V]. Since the gate of the n-channel MOSFET 132 is in a floating state, electric charges remain stagnant at this gate, so that the MOSFET 132 is sometimes on. When the MOSFET 132 is on, the output voltage 302*a* remains 0 [V]. When the output voltage 302*a* of the output terminal 140 is 0 [V], the n-channel MOSFET 101 is off. The voltage of the output terminal of the differential amplifier 120 increases and the n-channel MOSFET 102 turns on before long. Then, a gate voltage of the n-channel MOSFET 132 turns to 0 [V], so that the n-channel MOSFET 132 turns off. Thereafter, the output voltage 302*a* of the output terminal 140 increases toward 1.2 [V] that is the desired stabilization point. When the output voltage 302*a* increases, the n-channel MOSFET 101 turns on before long and the voltage of the output terminal of the differential amplifier 120 gradually lowers, so that the n-channel MOSFET 102 turns off. The MOSFET 101 turns on and the MOSFET 102 turns off, so that the startup operation is stopped, which means that the reference voltage generating circuit of this embodiment turns to the same circuit as the reference voltage generating circuit 200 in FIG. 2. Thereafter, the output voltage 302*a* of the reference voltage generating circuit of this embodiment reaches the stabilization point 1.2 [V] as in the operation of the reference voltage generating circuit 200 in FIG. 2.

As described above, in the startup circuit 100, the MOSFET 101 turns off in a first period of time after the power application, and thereafter is kept on. The MOSFET 102 turns on in a second period of time after the power application and thereafter is kept off.

The reference voltage generating circuit of this embodiment has a two-stage amplification circuit constituted of the differential amplifier 120 to amplify an input signal and the output amplifier 130 to amplify and output the reference voltage. The startup circuit 100 is connected between the output terminal of the differential amplifier 120 and the input terminal of the output amplifier 130, and has the first switch (MOSFET) 101 and the second switch (MOSFET) 102. The first and second switches 101, 102 are, for example, n-channel MOSFETs as described above. The first switch 101 connects the output terminal of the differential amplifier 120 and the input terminal of the output amplifier 130 according to the voltage of the output terminal 140 of the output amplifier 130. The second switch 102 connects the input terminal and the output terminal 140 of the output amplifier 130 according to the voltage of the output terminal of the differential amplifier 120.

Further, since the differential amplifier 120 and the output amplifier 130 perform amplification, the MOSFETs in the differential amplifier 120 and the output amplifier 130 are relatively large in size. On the other hand, the MOSFETs 101, 102 in the startup circuit 100 may be smaller in size than the MOSFETs in the differential amplifier 120 and the output amplifier 130 since no large current flows therethrough.

The use of the startup circuit 100 for the reference voltage generating circuit makes it possible to lead the output voltage of the output amplifier 130 to the one desired stabilization point out of the plural stabilization points. Further, since the startup circuit 100 is realized by two elements, namely, the MOSFETs 101, 102, the number of components thereof is small and its circuit is simple and easy to design. Moreover, downsizing is achieved since the MOSFETs 101, 102 may be small in size. Further, in the startup circuit 210 in FIG. 2, an unnecessary current flows through the MOSFETs 212, 213 in the normal operation after the startup operation is finished, as described above. On the other hand, such an unnecessary current does not flow in the startup circuit 100 of this embodiment, which allows reduction in power consumption.

The use of a startup circuit in a reference voltage generating circuit makes it possible to lead an output voltage of an output amplifier to one desired stabilization point out of a plurality of stabilization points. Further, since the startup circuit is realized by a first switch and a second switch, the number of components thereof is small and its circuit is simple and easy to design. Moreover, no unnecessary current flows in the startup circuit, which allows reduction in power consumption.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A reference voltage generating circuit comprising:
   a differential amplifier amplifying an input signal and generate a reference voltage;
   an output amplifier amplifying the reference voltage and outputting the amplified reference voltage; and
   a startup circuit connected between an output terminal of said differential amplifier and an input terminal of said output amplifier,
   wherein said startup circuit comprises:
   a first switch to connect the output terminal of said differential amplifier and the input terminal of said output amplifier according to a voltage of an output terminal of said output amplifier; and
   a second switch to connect the input terminal and the output terminal of said output amplifier according to a voltage of the output terminal of said differential amplifier.

2. The reference voltage generating circuit according to claim 1,
   wherein said first switch is a first field-effect transistor whose gate is connected to the output terminal of said output amplifier and whose source and drain are connected to the output terminal of said differential amplifier and the input terminal of said output amplifier respectively, and
   wherein said second switch is a second field-effect transistor whose gate is connected to the output terminal of said differential amplifier and whose source and drain are connected to the output terminal and the input terminal of said output amplifier respectively.

3. The reference voltage generating circuit according to claim 2, wherein the first and second field-effect transistors are n-channel metal-oxide semiconductor field-effect transistors.

4. The reference voltage generating circuit according to claim 2,
   wherein said differential amplifier and said output amplifier include field-effect transistors, and
   wherein the first and second field-effect transistors are smaller in size than the field-effect transistors in said differential amplifier and said output amplifier.

5. The reference voltage generating circuit according to claim 1, wherein a signal according to the output voltage of said output amplifier is feedback-inputted to said differential amplifier as the input signal.

6. The reference voltage generating circuit according to claim 1, wherein said startup circuit is a circuit to lead the output voltage of said output amplifier to one desired stabilization point out of a plurality of stabilization points.

7. The reference voltage generating circuit according to claim 1, wherein said first switch turns off in a first period of time after power application and thereafter is kept on.

8. The reference voltage generating circuit according to claim 7, wherein said second switch turns on in a second period of time after the power application and thereafter is kept off.

9. The reference voltage generating circuit according to claim 6, wherein said first switch turns off in a first period of time after power application and thereafter is kept on.

10. The reference voltage generating circuit according to claim 9, wherein said second switch turns on in a second period of time after the power application and thereafter is kept off.

11. The reference voltage generating circuit according to claim 10,
    wherein said first switch is a first field-effect transistor whose gate is connected to the output terminal of said output amplifier and whose source and drain are connected to the output terminal of said differential amplifier and the input terminal of said output amplifier respectively, and
    wherein said second switch is a second field-effect transistor whose gate is connected to the output terminal of said differential amplifier and whose source and drain are connected to the output terminal and the input terminal of said output amplifier respectively.

12. The reference voltage generating circuit according to claim 11, wherein the first and second field-effect transistors are n-channel metal-oxide semiconductor field-effect transistors.

13. The reference voltage generating circuit according to claim 12,
    wherein said differential amplifier and said output amplifier include metal-oxide semiconductor field-effect transistors, and
    wherein the first and second field-effect transistors are smaller in size than the metal-oxide semiconductor field-effect transistors in said differential amplifier and said output amplifier.

14. The reference voltage generating circuit according to claim 13, wherein a signal according to the output voltage of said output amplifier is feedback-inputted to said differential amplifier as the input signal.

* * * * *